United States Patent [19]

Tokarsky

[11] Patent Number: 4,729,921

[45] Date of Patent: Mar. 8, 1988

[54] HIGH DENSITY PARA-ARAMID PAPERS

[75] Inventor: Edward W. Tokarsky, Newark, Del.

[73] Assignee: E. I. Du Pont de Nemours and Company, Wilmington, Del.

[21] Appl. No.: 775,577

[22] Filed: Sep. 17, 1985

Related U.S. Application Data

[63] Continuation-in-part of Ser. No. 662,938, Oct. 19, 1984, abandoned.

[51] Int. Cl.$^4$ .......................... P04H 1/58; D21H 5/12
[52] U.S. Cl. ...................................... 428/288; 162/146; 162/157.3; 427/411; 428/323; 428/338
[58] Field of Search ............................ 162/157.3, 146; 428/323, 338, 288; 427/411

[56] References Cited

U.S. PATENT DOCUMENTS

| | | | |
|---|---|---|---|
| 3,756,908 | 9/1973 | Gross | 162/157.3 |
| 3,767,756 | 10/1973 | Blades | 524/422 |
| 3,869,429 | 3/1975 | Blades | 528/341 |
| 4,035,694 | 7/1977 | Barton et al. | 361/400 |
| 4,398,995 | 8/1983 | Sasaki et al. | 162/157.3 |
| 4,472,241 | 9/1984 | Provost | 162/28 |

FOREIGN PATENT DOCUMENTS 0128843 12/1984 European Pat. Off. .
2507123 12/1982 France .

OTHER PUBLICATIONS

Research Disclosure No. 13675, Aug. 1975.
Research Disclosure No. 19037, Feb. 1980.
Research Disclosure No. 21434, Feb. 1982.
Research Disclosure No. 21432, Feb. 1982.
Research Disclosure No. 22701, Mar. 1983.
Research Disclosure, No. 188, Item No. 18823, p. 674, (12/79).
IBM Technical Disclosure Bulletin, vol. 20, No. 2, p. 555, (7/77).

Primary Examiner—Theodore E. Pertilla

[57] ABSTRACT

High density para-aramid papers comprising 5 to 25 percent, by weight, binder and an amount of para-aramid fibers selected from the group consisting of para-aramid pulp, para-aramid floc and mixtures thereof, compacted to provide a volume percent para-aramid fiber of at least 53 minus 0.13 times the volume percent floc in the paper are useful in the preparation of circuit board substrates having a low coefficient of thermal expansion.

15 Claims, No Drawings

HIGH DENSITY PARA-ARAMID PAPERS

CROSS-REFERENCE TO RELATED APPLICATION

This application is a continuation-in-part of copending Ser. No. 662,938 filed Oct. 19, 1984 now abandoned.

DESCRIPTION

1. Technical Field

This invention relates to high density para-aramid papers, their preparation and their use in the preparation of laminates having a low coefficient of thermal expansion (CTE) suitable as substrates for printed circuit boards.

Printed circuit boards used in the electronics industry involving direct mounting of leadless ceramic chip carrier packages require low coefficients of thermal expansion of 12 parts per million/°C. or less to avoid the breaking of electrical connections to the circuit board on thermal cycling. The matrix resins used in the boards do not in themselves have low CTE's. Low CTE is obtained when reinforcing materials such as certain fibers having a low CTE are used in the boards. Kevlar ® 29 and 49 aramid fibers are known to have a low CTE and in the form of woven fabrics have been used as reinforcement in low CTE circuit boards. However, circuit boards reinforced with Kevlar ® aramid woven fabrics tend to develop undesirable resin micro-cracks at the point where the yarns cross-over in the woven fabric.

Kevlar ® aramid fibers are one kind of para-aramid fiber. Para-aramids are wholly aromatic polyamides whose chain extending bonds are either coaxial or parallel and oppositely directed. The para-aramid fibers are best prepared by the process of U.S. Pat. No. 3,767,756 to produce fibers as described in U.S. Pat. No. 3,869,429 which typically have filament tenacity of at least 18 gpd, (15.9 dN/tex) breaking elongation of at least 3.5 percent and filament modulus of at least 400 gpd (353 dN/tex). If desired, the fibers may be subjected to a heat treatment under tension to provide fibers having a higher modulus and lower breaking elongation.

It has now been found that printed circuit boards based on laminates of high density para-aramid paper, preferably containing both para-aramid pulp and para-aramid floc as defined hereinafter, have desirably low values of CTE and freedom from micro-cracks.

2. Brief Description of the Invention

This invention provides high density para-aramid paper comprising short para-aramid fibers selected from the group consisting of para-aramid pulp, para-aramid floc and mixtures thereof, compacted to provide a volume percent para-aramid fiber in the paper of at least 53 minus 0.13 times the volume percent floc in the fibers. Preferably, the para-aramid is poly(p-phenylene terephthalamide). Preferably the length of the para-aramid pulp is 0.1 to 6 mm and the length of the para-aramid floc is 0.8 to 12.7 mm. It is preferred that the para-aramid fibers consist of 0 to 50 volume percent para-aramid pulp and 50 to 100 volume percent para-aramid floc. The length of the para-aramid floc is more preferably 1.3 to 6.4 mm. More preferably the volume percent para-aramid fiber in the paper is at least 63 minus 0.13 times the volume percent para-aramid floc in the fibers. Preferably the paper contains 5 to 25 percent, by weight, most preferably 5 to 15 percent, binder. Water dispersible polymeric materials are preferred binders. Another preferred binder is aramid fibrids, preferably of poly(m-phenylene isophthalamide).

The high density para-aramid papers are prepared by a process comprising the steps of (1) preparing a 0.01 to 3 percent, by weight, aqueous slurry of para-aramid fibers selected from the group consisting of para-aramid pulp, para-aramid floc and mixtures thereof, (2) optionally adding a binder at 5 to 25 percent, by weight, of total solids, (3) forming a sheet from the slurry using known papermaking methods, (4) drying the thusly formed sheet and (5) calendering the sheet in one or more steps between rigid rolls heated at 125°–400° C. at a pressure of 500 to 5000 lbs/inch (89.4 to 894 kg/cm) nip pressure. Preferably the para-aramid pulp has a length of 0.1 to 6 mm and the para-aramid floc has a length of 0.8 to 12.7 mm. Preferably the para-aramid is poly(p-phenylene terephthalamide). Preferably the para-aramid fibers consist of 10 to 50 percent, by volume, para-aramid pulp and 50 to 90 percent, by volume, para-aramid floc. When a binder is used the paper is preferably 5 to 25 percent, by weight, of a water dispersible resin or of aramid fibrids. Most preferably the aramid fibrids are poly(m-phenylene isophthalamide) fibrids.

The high density para-aramid paper of the present invention is especially suited for the preparation of an electrical circuit board substrate containing at least one layer of the high density para-aramid paper, and a volume percent total matrix binder of no more than 52 plus 0.13 times the volume percent para-aramid floc in the para-aramid fibers in the layers, but no less than 15 volume percent total binder. Preferably the paper is 50 to 80 volume percent para-aramid fibers. Most preferably the para-aramid is poly(p-phenylene terephthalamide). Preferably, the volume percent of total matrix binder is no more than 42 plus 0.13 times the volume percent para-aramid floc in the para-aramid fibers in the layers.

DETAILED DESCRIPTION OF THE INVENTION

Floc

Floc is a term applied to designate papermakers staple, i.e., staple fibers having a length of 0.5 inch (12.7 mm) or shorter. The longer the floc, the better its reinforcement of resin composites. On the other hand, longer floc is more difficult to process into uniform wet-laid papers thus tending to restrict the kinds of paper machines which may be used. Thus, preferred length of floc for use in this invention is in the range of 0.05 to 0.25 inch (1.3 to 6.4 mm). Floc length as short as 0.03 inch (0.8 mm) processes well, but shorter lengths also increase the difficulties of papermaking and reinforce resin composites less well.

The floc employed in the Examples was cut from yarns of poly(p-phenylene terephthalamide) consisting of 1.5 denier (1.67 dtex) filaments. Feed yarns were 1140 denier (1267 dtex) "Kevlar" 49 aramid yarns produced by E. I. du Pont de Nemours and Company. ("Kevlar" is a registered trademark). These yarns are characterized by tensile strengths of about 23 gpd (20.3 dN/tex) and tensile moduli of about 950 gpd (840 dN/tex). "Kevlar" 49 yarns are frequently designated as high-modulus yarns. The floc may also be from "Kevlar" 29 yarns which are characterized by equivalent tenacities but have lower moduli of about 550 gpd (486 dN/tex).

Pulp

Pulp is formed by mechanically abrading staple fibers to reduce their sizes and provide many fibrils, mostly attached to fiber "trunks" but also unattached. Refiners common to the preparation of woodpulp are suitable. The degrees of size-reduction and of fibrillation are controlled both by adjustments of the refiner and by the number of passes through it. In the Examples, feed for pulping was random-length chopped fibers. Most of the pulps were from "Kevlar" 29 fibers, but Example III used "Kevlar" 49 fibers. The pulps employed were characterized by Canadian Standard Freeness and by Clark Classification. In general, the more highly refined pulps were easier to process on paper machines. Preferred para-aramid pulps have fiber lengths in the range of 0.1 to 6 mm, and their fibrils are much finer, e.g., as fine as 0.1 microns in diameter.

Fibrids

Fibrids are small non-granular, non-rigid fibrous or film-like particles. Two of their three dimensions are on the order of microns. Aromatic polyamide fibrids may be prepared by precipitating a solution of the aromatic polyamide into a coagulating liquid as for example using fibridating apparatus of the type disclosed in U.S. Pat. No. 3,018,091. The fibrids are preferably fibrids of poly(m-phenylene isophthalamide).

Paper Binder Resins

The binder resins useful in the high density para-aramid papers of the present invention are preferably water dispersible thermosetting resins such as epoxy resins, phenolic resins, polyureas, polyurethanes, melamine formaldehyde resins, polyesters and alkyd resins. Most preferred are binders consisting of water-dispersible epoxy resins. Fluorocarbon resins may also be used where their special properties, e.g., low dielectric constant, low dielectric loss, and low moisture regain, are desired.

Use of binders such as fibrids or binder resins greatly facilitates the handling of the para-aramid papers during preparation of the papers and are essential when the papers are to be continuously impregnated with resin for the preparation of laminates. When batch methods of paper preparation are used, the binder may be omitted at the expense of ease of handling. When continuous papermaking processes are used, binder at less than 5 percent, by weight, of total solids provides inadequate effect and at more than 25 percent, by weight, of total solids is not generally retained by the fibers.

Binder Matrix Resins for Laminates

The same resins useful as paper binder resins (see above) are useful in the preparation of laminates except that the resins used in the preparation of laminates need not be water dispersible. Also useful as binder resins are polyimides, diallyl phthalate resins, bismaleimide-triazine resins, poly(butadiene), and polyolefins.

Papers providing the lowest CTE values in laminates are those containing the largest volume percent para-aramid fibers (pulp and/or floc) and otherwise are those containing the highest volume percent floc. Long floc in general provides lower CTE values in laminates but increases the difficulty of processing on paper machines. The best compromise for floc length appears to be in the range of 1.3 to 6.4 mm.

TEST METHODS

Canadian Standard Freeness

This is a procedure for measuring the rate at which a suspension of 3 grams of fibrous material in 1.0 L of water drains. Measurement and apparatus are according to TAPPI Standard T227 m-58. Results are reported as volume (mL) of water drained under standard conditions. The measured value is affected by the fineness and flexibility of the fibers and by their degree of fibrillation.

Clark Classification

This test measures the distribution of fiber sizes in a supply of fibrous material, e.g., pulp as described above. It is as detailed in TAPPI Standard T233 os-75 employing a Clark-type classifier. Basically it measures the weight percentage of fibrous stock retained on each of four progressively finer screens through which it is passed. The percentage passing through all four screens is obtained by difference, i.e., by subtracting from 100 the sum of the retentions of all four screens. In the examples, the screen sizes employed were 14, 30, 50, and 100 mesh (U.S. Standard) with openings in mm of 1.41, 0.595, 0.297, and 0.149, respectively.

Paper Thickness (t)

This refers to the thickness of unimpregnated single plies. A TMI Model 549 micrometer with a 0.25 inch (6.35 mm) diameter foot and dead-weight load of 25 psi (172 kPa) was employed. Several measurements were taken over the area of each sheet for all sheets involved in a given laminate and the measurements averaged to provide the reported thicknesses. The method used in measuring thicknesses of impregnated, plied, and cured laminates is not critical.

Basis Weight (BW)

This is the areal density of a sheet product expressed as weight per unit of area. In this specification, basis weight is computed only from weights of pulp and floc involved and does not include the weight of any binder involved. Primary units herein are $oz/yd^2$ which are convertible to $g/m^2$ through multiplication by 33.9.

PULP/FLOC VOLUME PERCENTAGE ($V_p$ and $V_f$)

Volume percentage, V, is a measure of the effectiveness of calendering in increasing the density of sheets. The pulp and floc used herein have a density of 1.44 g/mL. Volume percentage is the percentage of the total volume of a sheet or laminate occupied by its content of floc and pulp; the balance being binder and voids. In English units, $$V_p = \frac{(BW)}{t} \times 92.4$$

$$V_f = \frac{(BW_n)}{t_n} \times 92.4$$

where
  $V_p$ is volume percentage in a single sheet
  $V_f$ is volume percentage in a laminate of n sheets
  BW is basis weight in oz/yd2 (para-aramid fibers only)
  $BW_n$ is the sum of BW for n sheets
  t is single sheet thickness in mils
  $t_n$ is laminate thickness in mils (thickness of any copper facing sheets is subtracted).

In SI units, the corresponding equations are:

$$V_p = \frac{(BW)}{t} \times 0.6944$$

-continued
$$V_f = \frac{(BW_n)}{t_n} \times 0.6944$$

where BW is in g/m2
t is in mm

COEFFICIENT OF THERMAL EXPANSION (CTE)

This is a measure of in-plane thermal expansion. Specimens of laminates were cut to 0.375 inch (9.5 mm) long and 0.1875 inch (4.76 mm) wide. Prior to measurement, each specimen was preconditioned in the sample cell of a Du Pont Model 943 Thermo Mechanical Analyzer. This involved heating to 180° C., maintaining 180° C. for 10 minutes, and cooling to 40° C. at 2° C./min. Subsequently the specimens were reheated from 40 to 180° C. at 5° C./min while the dilation response was analyzed using a Du Pont System 1090 Thermal Analyzer provided with software to compute CTE by linear regression between the two temperature limits of 45 to 100° C. Output of the latter is a plot of dimensional change in $\mu$m vs. temperature in ° C. Also provided on the plot is CTE in $\mu$m/m/° C.

EXAMPLES

Examples 1 to 4 show the production of handsheets by wet papermaking, their compaction into high density papers and the preparation of laminates made from the high density paper.

Handsheets were prepared as follows: Into 800 mL of water in a Waring blender were added dried pulp and, where used, dried floc at weights selected to provide wet-laid sheets of about 3 oz/yd$^2$ (102 g/m$^2$. Tables I to IV show measured average basis weights of resultant sheets calculated on the weights of pulp and floc used only. Also, "% Floc" designates the weight percentage of the reported basis weight contributed by floc. This mixture was blended 30 to 60 sec together with 1.92 g of an epoxy resin stock solution added immediately after the blender was turned on. The paper former was an M/K Systems Series 8000 Sheet Former designed to wet-lay 12-inch (30.48 cm) square sheets. The slurry in the Waring blender was poured into the tank of the paper former which contained 26,000 mL of water. Mixing in the tank was for about 30 sec prior to dewatering on the paper former. Resultant handsheets were partially dried on a drum dryer at 100° C. for about 1 min and then completely dried in a forced air oven at 120° C. for 3 to 4 hr.

The epoxy resin stock solution was prepared using an aqueous epoxy resin dispersion (55 weight percent solids; Celanese CMD-W55-5003). It was mixed by first dissolving 101 g of dicyandiamide crystals in ⅓ gallon (1.26 L) of water at 75° C., adding 4.2 g of 2-methylimidazole, agitating to complete solution, and then pouring the still hot solution into ⅔ gallon (2.52 L) of the epoxy resin dispersion. After mixing, at least 1 hr elapsed before use.

In some of the tests, sheets were made with and without resin to check on how much resin was retained in the paper. It was found that all the added resin was retained. Most of the basis weights reported in Tables I to IV were then obtained by measuring the basis weight of the resin-containing paper and multiplying it by 0.925 to remove the 7.5 percent, by weight, contributed by the resin.

Each sheet was then compacted using a two-roll calender with steel rolls. Nip pressure, roll temperature, and sheet velocity are shown in Tables I to IV under "Compaction". Hard, non-deformable rolls are generally required.

For each of the examples shown in Tables I to IV, 10 identical sheets were prepared as described above. Each sheet was impregnated by hand in a 40 percent acetone solution of epoxy resin (Hercules 3501-6), and the 10 sheets were stacked together and autoclaved using a standard vacuum bag layup. In this layup, the 10-sheet stack was covered on both faces with a 3-mil (0.076 mm) polyfluorocarbon release film, and covered again on both faces with a ferrotype plate coated with release agent. Under the bottom ferrotype plate was placed another polyfluorocarbon film, and above the top ferrotype plate was placed first a plate of 0.25 inch (0.635 cm) thick aluminum and then another polyfluorocarbon layer. This whole assembly was covered in a vacuum bag (Zip-Vac Inc.) and placed in an autoclave. Vacuum was pulled on the bag for 60 min at room temperature with the autoclave at 0 psig (0 kPa, gauge), and then autoclave temperature was raised over 5 min to 158° F. (70° C.). This temperature was held for 1 hr and then autoclave pressure was raised to 25 psig (172.4 kPa, gauge) over 5 min. Temperature was raised over 10 min to 248° F. (120° C.) and held 1 hr. Temperature was again raised over 15 min to 400° F. (204.4° C.) and held 2 hr. After cooling to 100° F. (37.8° C.) over about 20 min under pressure, the pressure was released and the laminate removed.

Thickness of the laminate and its coefficient of thermal expansion (CTE) are shown in the tables. Also shown are $V_p$ (percentage of single-sheet volume occupied by pulp and floc) and $V_f$ (percentage of the volume of the laminate occupied by pulp and floc). The reason why $V_f$ is smaller than $V_p$ is that the resin bonding between stacked sheets necessarily creates a small additional volume.

EXAMPLE I

Handsheets and laminates were prepared as described above, conditions and results being as shown in Table I. Floc employed was cut to either 1/16 inch (1.59 mm) or 1/32 inch (0.79 mm) lengths as shown. The pulp was of Kevlar ® 29 and had a Canadian Standard Freeness of 620 mL and Clark Classification as follows:

| Screen Size, Mesh | % Retained |
|---|---|
| 14 | 25.4 |
| 30 | 31.8 |
| 50 | 13.7 |
| 100 | 11.2 |
| >100 (by difference) | 17.9 |

This distribution describes relatively coarse pulp particles.

EXAMPLE II

This example essentially reproduces Example I except for the pulp employed, which was prepared from the same yarns but was characterized by a Canadian Standard Freeness of 182 mL and Clark Classification as follows:

| Screen Size, Mesh | % Retained |
| --- | --- |
| 14 | 1.5 |
| 30 | 19.8 |
| 50 | 21.3 |
| 100 | 26.4 |
| >100 (by difference) | 31.0 |

This distribution defines a relatively fine pulp. Conditions and results are shown in Table II.

EXAMPLE III

This example differs from Examples I, II, and IV essentially in that the pulp was prepared from Kevlar ® 49 yarns and was characterized by Canadian Standard Freeness of 392 mL and a Clark Classification as follows:

| Screen Size, Mesh | % Retained |
| --- | --- |
| 14 | 15.49 |
| 30 | 23.14 |
| 50 | 27.25 |
| 100 | 18.04 |
| >100 (by difference) | 16.08 |

This pulp was not quite as coarse as that of Example I. Conditions and results are shown in Table III.

EXAMPLE IV

This example differs from Example I and II essentially in that still another pulp from the same filaments was used having a Canadian Standard Freeness of 230 and a Clark Classification as follows:

| Screen Size, Mesh | % Retained |
| --- | --- |
| 14 | 2.01 |
| 30 | 16.47 |
| 50 | 24.10 |
| 100 | 27.71 |
| >100 (by difference) | 29.71 |

This pulp was only slightly coarser than the pulp of Example II. Conditions and results are shown in Table IV.

EXAMPLE V

This example exemplifies the use of fibrids of poly-m-phenylene isophthalamide as binder in initial wet laying instead of the resin employed in Examples I to IV. Otherwise, the preparation and testing were substantially as described for those examples except that impregnation of the sheets just prior to lamination utilized a bismaleimide/triazine/epoxy resin matrix binder system with 30 percent epoxy resin, by weight.

The fibrids used in this example were prepared substantially as described in Gross U.S. Pat. No. 3,756,908 in its Example I. Fibrids are prepared by shear-precipitation of a polymer solution in a non-solvent liquid, and they are small, non-granular, non-rigid fibrous or film-like particles of which two of their three dimensions are of the order of micrometers. Their suppleness permits entwining about fibers used to prepare wet-laid papers, thus being effective binders.

In this example, fibrids were added to the dispersion of pulp and floc just before wet-laying, i.e., analogously to the binder resin of Examples I to IV. The floc at 1/16 inch (1.59 mm) length constituted 60 percent, by weight, of the pulp/floc content, and 5 percent of total solids weight in fibrids was added. Basis weight of the paper as-formed was 3.05 oz/yd$^2$ (103.4 g/m$^2$) which, when corrected for weight of fibrids gave a basis weight for pulp/floc of 2.90 oz/yd$^2$ (98.5 g/m$^2$). Thickness of the paper after calendering at 3500 pli (612.9 kN/m) was 4.1 mils (0.104 mm). This computes to $V_p$=65.6 percent. The CTE for a 10-sheet laminate prepared as in Examples I to IV was 5.6 and 7.2 μm/m/° C. in the cross and machine directions, respectively. The laminate had a $V_f$ of 59 to 64 percent. It is seen that fibrids of poly-m-phenylene isophthalamide are very effective binders for sheet formation.

EXAMPLE VI

Pulp of low-modulus poly-p-phenylene terephthalamide fibers was prepared as in Example I. Canadian Standard Freeness was 230 mL, and Clark Classification was as follows:

| Screen Size, Mesh | % Retained |
| --- | --- |
| 14 | 2.01 |
| 30 | 16.47 |
| 50 | 24.10 |
| 100 | 27.71 |
| >100 (by difference) | 29.71 |

Papers of this pulp (neither added floc nor binders) were prepared on a 36 inch (0.914 m) Fourdrinier paper machine. Because these papers as formed were too weak to withstand impregnation without tearing, they were precalendered (substituting for addition of resin binder). A fabric calender having one steel roll and one composite roll was used, the nip-loading force being 2200 pli (385.3 kN/m). The $V_p$ for this precalendered paper was about 49 percent.

The precalendered paper was cut to rolls 13 inches (33 cm) wide and calendered between chilled iron rolls at 3700 pli (647.9 kN/m) at 400° F. (207° C.) and 5 ft/min (1.52 m/min). Due to calender roll bending at this high pressure, the calendered sheets had thicknesses ranging from 3.2 to 4.3 mils (0.081 to 0.109 mm) edge to center and volume percentages ($V_p$) from about 70 to about 90 percent.

Ten 13-inch (33 cm) square sheets were impregnated by hand in a 40 percent solution of Hercules 3501-6 epoxy resin matrix binder in acetone and plied together with a sheet of electrodeposited copper foil on each face. This assembly was vacuum-bag autoclave cured as described for Examples I to IV. The volume percentage ($V_f$) of pulp in the resultant laminate, excluding the contributions of the copper foils, was 75 to 81 percent. Copper was etched away from a portion of the laminate. The CTE measured was 10.1 μm/m/° C.

From the remainder of the laminate, four replicate, double-sided circuit boards were etched. On each board were mounted three leadless ceramic chip carriers (LCCC's), one 40, one 48, and one 64 terminal LCCC all having 50 mil (1.3 mm) terminal spacings. Thermal cycling between −55° C. and 125° C. was carried out, the boards being examined periodically for inspection of the solder joints. After 306 cycles, no failures of solder joints or micro-cracks were observed.

EXAMPLE VII

This example was performed substantially the same as for Example VI except that 17 percent, by weight, of the pulp was replaced with ⅛ inch (3.18 mm) floc of the high-modulus poly-p-phenylene terephthalamide fibers. The pulp had a Canadian Standard Freeness of 221 mL and Clark Classification as follows:

| Screen Size, Mesh | % Retained |
|---|---|
| 14 | 2.24 |
| 30 | 15.22 |
| 50 | 19.72 |
| 100 | 23.58 |
| >100 (by difference) | 39.24 |

Basis weight was 2.1 oz/yd² (71.2 g/m²). Precalendering and roll cutting were exactly as for Example VI yielding, after calendering as in Example VI, thicknesses from 2.3 to 3.0 mils (0.058 to 0.076 mm) and volume pecentages ($V_p$) from 68 to 83 percent. Copper foil (0.5 oz/yd²; 16.9 g/m²) was added to each face of a 10-sheet laminate prepared exactly as in Example VI. Calculated $V_f$ was 64 to 74 percent. CTE for a sample with copper foil etched away was 7.8 μm/m/° C. The circuit boards prepared as in Example VI showed no sign of solder joint failure or micro-cracks after 306 thermal cycles.

EXAMPLE VIII

This example is the same as Example VII except that 33 percent of the pulp was replaced with floc rather than 17 percent and final calendering was at 1200 pli (210.1 kN/m). Basis weight was 2.1 oz/yd² (71.2 g/m²), and calendered thickness ranged from 2.4 to 2.9 mils (0.061 to 0.074 mm) corresponding to $V_p$ from 66 to 79 percent. After lamination of 10 sheets doubly faced with copper foil, volume percentage ($V_f$) was 61 to 67 percent. The CTE was 6.9 μm/m/° C. No solder joint failures or micro-cracks occurred in 306 thermal cycles.

EXAMPLE IX

This example is the same as Example V except that no pulp at all was used, the floc was 0.5 inch (12.7 mm) in length, and fibrids were present at 10 percent, by weight, of the total solids used. Basis weight of the paper as-formed was 3.90 oz/yd² (132.3 g/m²) which, when corrected for the weight of fibrids, gave a basis weight for the floc of 3.51 oz/yd² (119.1 g/m²). Thickness of the paper after calendering at 3500 pli (612.9 kN/m) was 5.0 mils (0.127 mm). This computes to $V_p = 64.8$ percent. The CTE for a 12-ply laminate prepared as in Example I was 7.9 and 4.0 μm/m/° C. in the machine and cross directions, respectively. The $V_f$ for the laminate was 63 percent.

TABLE I
HANDSHEETS & LAMINATES FROM RELATIVELY COARSE PULP

| Example No. | % Floc | Floc Length in (mm) | Basis Weight oz/yd² (g/m²) | Compaction Pressure lb/in (kN/m) | Compaction Temp. °C. | Compaction Velocity ft/min (m/min) | Sheet Thickness mils (mm) | $V_p$ % | CTE um/m/°C. | $V_f$ % | Laminate Thickness mils (mm) |
|---|---|---|---|---|---|---|---|---|---|---|---|
| 1-A | 0 | — | 2.82 (95.6) | 500 (87.6) | 150 | 5 (1.52) | 5.5 (0.139) | 47 | 17.9 | 45 | 57.8 (1.468) |
| B | 15 | 1/32 (0.79) | 2.79 (94.6) | 500 (87.6) | 150 | 5 (1.52) | 5.6 (0.142) | 46 | 14.4 | 38 | 68.3 (1.735) |
| C | 15 | 1/32 (0.79) | 2.79 (94.6) | 1500 (262.7) | 150 | 5 (1.52) | 4.8 (0.121) | 54 | 14.0 | 44 | 58.4 (1.483) |
| D | 30 | 1/32 (0.79) | 2.65 (89.8) | 500 (87.6) | 150 | 5 (1.52) | 5.4 (0.137) | 45 | 11.5 | 40 | 61.9 (1.572) |
| E | 30 | 1/32 (0.79) | 2.65 (89.8) | 1500 (262.7) | 150 | 5 (1.52) | 4.7 (0.118) | 53 | 13.0 | 43 | 57.9 (1.471) |
| F | 60 | 1/32 (0.79) | 2.64 (89.5) | 500 (87.6) | 150 | 5 (1.52) | 5.4 (0.136) | 45 | 15.0 | 39 | 63.0 (1.600) |
| G | 60 | 1/32 (0.79) | 2.64 (89.5) | 1500 (262.7) | 150 | 5 (1.52) | 4.5 (0.114) | 54 | 6.1 | 51 | 48.1 (1.222) |
| H | 90 | 1/32 (0.79) | 2.58 (87.5) | 500 (87.6) | 150 | 5 (1.52) | 6.1 (0.154) | 39 | 14.1 | 35 | 68.1 (1.730) |
| I | 90 | 1/32 (0.79) | 2.62 (88.8) | 1500 (262.7) | 150 | 5 (1.52) | 4.8 (0.122) | 50 | 8.5 | 42 | 58.4 (1.483) |
| J | 30 | 1/16 (1.59) | 2.81 (95.3) | 500 (87.6) | 150 | 5 (1.52) | 6.0 (0.152) | 43 | 16.1 | 40 | 65.6 (1.666) |
| K | 30 | 1/16 (1.59) | 2.81 (95.3) | 1500 (262.7) | 150 | 5 (1.52) | 4.9 (0.123) | 54 | 13.0 | 43 | 60.0 (1.524) |
| L | 60 | 1/16 (1.59) | 2.72 (92.2) | 500 (87.6) | 150 | 5 (1.52) | 6.2 (0.158) | 41 | 14.4 | 36 | 69.9 (1.775) |
| M | 60 | 1/16 (1.59) | 2.72 (92.2) | 1500 (262.7) | 150 | 5 (1.52) | 4.9 (0.123) | 52 | 6.2 | 48 | 52.5 (1.334) |
| N | 90 | 1/16 (1.59) | 2.78 (94.2) | 500 (87.6) | 150 | 5 (1.52) | 6.9 (0.174) | 37 | 12.7 | 32 | 79.5 (2.019) |
| O | 90 | 1/16 (1.59) | 2.70 (91.5) | 1500 (262.7) | 150 | 5 (1.52) | 4.9 (0.125) | 51 | 10.3 | 41 | 61.6 (1.565) |
| P | 0 | — | 3.07 (104.1) | 3500 (612.9) | 200 | 10 (3.05) | 3.9 (0.099) | 73 | 10.3 | 58 | 48.9 (1.242) |
| Q | 90 | 1/32 (0.79) | 2.85 (96.6) | 3500 (612.9) | 200 | 10 (3.05) | 3.9 (0.098) | 68 | 5.5 | 53 | 50.1 (1.273) |
| R | 30 | 1/16 (1.59) | 3.07 (104.1) | 3500 (612.9) | 200 | 10 (3.05) | 3.9 (0.098) | 73 | 7.6 | 56 | 51.3 (1.303) |
| S | 60 | 1/16 (1.59) | 3.09 (104.8) | 3500 (612.9) | 200 | 10 (3.05) | 4.0 (0.103) | 70 | 5.4 | 52 | 55.3 (1.405) |
| T | 90 | 1/16 (1.59) | 3.24 (109.8) | 3500 (612.9) | 200 | 10 (3.05) | 4.2 (0.106) | 72 | 3.9 | 64 | 47.1 (1.196) |

TABLE II
HANDSHEETS & LAMINATES FROM RELATIVELY FINE PULP

| Example No. | % Floc | Floc Length in (mm) | Basis Weight oz/yd² (g/m²) | Compaction Pressure lb/in (kN/m) | Compaction Temp. °C. | Compaction Velocity ft/min (m/min) | Sheet Thickness mils (mm) | $V_p$ % | CTE um/m/°C. | $V_f$ % | Laminate Thickness mils (mm) |
|---|---|---|---|---|---|---|---|---|---|---|---|
| 2-A | 0 | — | 2.81 (95.3) | 500 (87.6) | 150 | 5 (1.52) | 4.6 (0.116) | 57 | delaminated | | |
| B | 0 | — | 2.81 (95.3) | 1500 (262.7) | 150 | 5 (1.52) | 4.2 (0.106) | 62 | 11.1 | 47 | 55.3 (1.405) |
| C | 15 | 1/32 (0.79) | 2.82 (95.6) | 500 (87.6) | 150 | 5 (1.52) | 5.6 (0.142) | 46 | 13.4 | 44 | 59.0 (1.499) |
| D | 15 | 1/32 (0.79) | 2.82 (95.6) | 1500 (262.7) | 150 | 5 (1.52) | 5.0 (0.126) | 53 | — | — | — |
| E | 30 | 1/32 (0.79) | 2.81 (95.3) | 500 (87.6) | 150 | 5 (1.52) | 5.6 (0.142) | 46 | 10.2 | 42 | 62.7 (1.593) |
| F | 30 | 1/32 (0.79) | 2.81 (95.3) | 1500 (262.7) | 150 | 5 (1.52) | 4.7 (0.120) | 54 | 13.1 | 44 | 58.8 (1.494) |
| G | 60 | 1/32 (0.79) | 2.90 (98.3) | 500 (87.6) | 150 | 5 (1.52) | 6.0 (0.152) | 44 | 12.4 | 41 | 66.0 (1.676) |
| H | 60 | 1/32 (0.79) | 2.90 (98.3) | 1500 (262.7) | 150 | 5 (1.52) | 5.0 (0.126) | 54 | 11.7 | 45 | 59.3 (1.506) |
| I | 90 | 1/32 (0.79) | 2.69 (91.2) | 500 (87.6) | 150 | 5 (1.52) | 6.0 (0.152) | 42 | 10.3 | 38 | 65.9 (1.674) |
| J | 90 | 1/32 (0.79) | 2.70 (91.5) | 1500 (262.7) | 150 | 5 (1.52) | 4.7 (0.118) | 54 | 10.4 | 43 | 57.6 (1.463) |
| K | 30 | 1/16 (1.59) | 2.80 (94.9) | 500 (87.6) | 150 | 5 (1.52) | 5.5 (0.140) | 47 | 10.4 | 41 | 63.9 (1.623) |
| L | 30 | 1/16 (1.59) | 2.80 (94.9) | 1500 (262.7) | 150 | 5 (1.52) | 4.8 (0.121) | 54 | delaminated | | |
| M | 60 | 1/16 (1.59) | 2.82 (95.6) | 500 (87.6) | 150 | 5 (1.52) | 5.9 (0.150) | 44 | 12.5 | 40 | 65.8 (1.671) |

TABLE II-continued

HANDSHEETS & LAMINATES FROM RELATIVELY FINE PULP

| Example No. | % Floc | Floc Length in (mm) | Basis Weight oz/yd² (g/m²) | Compaction Pressure lb/in (kN/m) | Compaction Temp. °C. | Compaction Velocity ft/min (m/min) | Sheet Thickness mils (mm) | $V_p$ % | CTE um/m/°C. | $V_f$ % | Laminate Thickness mils (mm) |
|---|---|---|---|---|---|---|---|---|---|---|---|
| N | 60 | 1/16 (1.59) | 2.82 (95.6) | 1500 (262.7) | 150 | 5 (1.52) | 4.9 (0.123) | 54 | 8.0 | 47 | 55.5 (1.410) |
| O | 90 | 1/16 (1.59) | 2.76 (93.6) | 500 (87.6) | 150 | 5 (1.52) | 6.5 (0.164) | 40 | 10.4 | 36 | 70.9 (1.801) |
| P | 90 | 1/16 (1.59) | 2.77 (93.9) | 1500 (262.7) | 150 | 5 (1.52) | 5.1 (0.129) | 50 | 7.5 | 44 | 57.8 (1.468) |
| Q | 0 | — | 2.95 (100.0) | 3500 (612.9) | 200 | 10 (3.05) | 3.4 (0.087) | 79 | delaminated | | |
| R | 30 | 1/32 (0.79) | 3.22 (109.2) | 3500 (612.9) | 200 | 10 (3.05) | 3.9 (0.098) | 77 | 9.3 | 45 | 65.9 (1.674) |
| S | 60 | 1/32 (0.79) | 3.16 (107.1) | 3500 (612.9) | 200 | 10 (3.05) | 4.0 (0.101) | 73 | 7.4 | 56 | 52.9 (1.344) |
| T | 90 | 1/32 (0.79) | 2.98 (101.0) | 3500 (612.9) | 200 | 10 (3.05) | 3.8 (0.095) | 73 | 4.7 | 53 | 52.4 (1.331) |
| U | 30 | 1/16 (1.59) | 3.12 (105.8) | 3500 (612.9) | 200 | 10 (3.05) | 3.8 (0.096) | 76 | 7.5 | 56 | 51.3 (1.303) |
| V | 60 | 1/16 (1.59) | 3.20 (108.5) | 3500 (612.9) | 200 | 10 (3.05) | 4.0 (0.102) | 73 | 7.5 | 60 | 49.4 (1.255) |
| W | 90 | 1/16 (1.59) | 3.03 (102.7) | 3500 (612.9) | 200 | 10 (3.05) | 4.0 (0.102) | 69 | 4.5 | 55 | 51.6 (1.311) |

TABLE III

HANDSHEETS & LAMINATES FROM HIGH-MODULUS PULP

| Example No. | % Floc | Floc Length in (mm) | Basis Weight oz/yd² (g/m²) | Compaction Pressure lb/in (kN/m) | Compaction Temp. °C. | Compaction Velocity ft/min (m/min) | Sheet Thickness mils (mm) | $V_p$ % | CTE um/m/°C. | $V_f$ % | Laminate Thickness mils (mm) |
|---|---|---|---|---|---|---|---|---|---|---|---|
| 3-A | 0 | — | 2.86 (97.0) | 1500 (262.7) | 150 | 5 (1.52) | 4.4 (0.111) | 60 | 10.4 | 48 | 55.1 (1.399) |
| B | 60 | 1/32 (0.79) | 2.83 (95.9) | 500 (87.6) | 150 | 5 (1.52) | 5.9 (0.151) | 44 | 12.2 | 42 | 63.1 (1.603) |
| C | 60 | 1/32 (0.79) | 2.83 (95.9) | 1500 (262.7) | 150 | 5 (1.52) | 5.1 (0.129) | 52 | 8.1 | 48 | 54.6 (1.387) |
| D | 80 | 1/32 (0.79) | 2.65 (89.8) | 500 (87.6) | 150 | 5 (1.52) | 6.6 (0.167) | 37 | 16.4 | 33 | 74.0 (1.880) |
| E | 80 | 1/32 (0.79) | 2.65 (89.8) | 1500 (262.7) | 150 | 5 (1.52) | 4.9 (0.124) | 50 | 10.9 | 44 | 55.5 (1.410) |

TABLE IV

HANDSHEETS & LAMINATES FROM MEDIUM-COARSE PULP

| Example No. | % Floc | Floc Length in (mm) | Basis Weight oz/yd² (g/m²) | Compaction Pressure lb/in (kN/m) | Compaction Temp. °C. | Compaction Velocity ft/min (m/min) | Sheet Thickness mils (mm) | $V_p$ % | CTE um/m/°C. | $V_f$ % | Laminate Thickness mils (mm) |
|---|---|---|---|---|---|---|---|---|---|---|---|
| 4-A | 0 | — | 3.07 (104.1) | 3500 (612.9) | 200 | 10 (3.05) | 3.8 (0.097) | 74 | 8.0 | 54 | 53.1 (1.349) |
| B | 30 | 1/32 (0.79) | 3.15 (106.8) | 3500 (612.9) | 200 | 10 (3.05) | 3.7 (0.094) | 78 | delaminated | | |
| C | 60 | 1/32 (0.79) | 3.15 (106.8) | 3500 (612.9) | 200 | 10 (3.05) | 3.8 (0.096) | 77 | delaminated | | |
| D | 90 | 1/32 (0.79) | 2.94 (99.7) | 3500 (612.9) | 200 | 10 (3.05) | 3.8 (0.095) | 72 | 7.2 | 56 | 48.4 (1.229) |
| E | 30 | 1/16 (1.59) | 3.15 (106.8) | 3500 (612.9) | 200 | 10 (3.05) | 4.0 (0.102) | 72 | 6.8 | 58 | 50.1 (1.273) |
| F | 60 | 1/16 (1.59) | 3.15 (106.8) | 3500 (612.9) | 200 | 10 (3.05) | 4.1 (0.104) | 71 | 6.7 | 57 | 51.0 (1.295) |
| G | 90 | 1/16 (1.59) | 3.01 (102.0) | 3500 (612.9) | 200 | 10 (3.05) | 3.9 (0.098) | 72 | 7.3 | 53 | 52.9 (1.344) |

What is claimed is:

1. High density para-aramid paper for use in an electrical circuit board laminates having low coefficient of thermal expansion comprising 5 to 15 percent, by weight, based on the total solids content of the paper, of a polymeric binder of aramid fibrids and short para-aramid fibers made up of 0–50 volume percent para-aramid pump and 50–100 volume percent para-aramid floc having lengths of 0.8 to 12.7 mm, the fibers being compacted at a nip pressure of 1500 to 5000 lbs/inch (268 to 894 kg/cm) to provide a volume percent para-aramid fiber in the paper of at least 53 minus 0.13 times the volume percent para-aramid floc in the fibers.

2. The paper of claim 1 wherein the para-aramid is poly(p-phenylene terephthalamide).

3. The paper of claim 1 wherein the volume percent para-aramid fiber in the paper is at least 63 minus 0.13 times the volume percent para-aramid floc in the fibers.

4. The paper of claim 2 wherein the volume percent para-aramid fiber in the paper is at least 63 minus 0.13 times the volume percent para-aramid floc in the fibers.

5. The paper of claim 1 wherein the length of the para-aramid floc is 1.3 to 6.4 mm.

6. The paper of claim 2 wherein the aramid fibrids are poly(m-phenylene isophthalamide) fibrids.

7. The paper of claim 3 wherein the aramid fibrids are poly(m-phenylene isophthalamide) fibrids.

8. The paper of claim 4 wherein the aramid fibrids are poly(m-phenylene isophthalamide) fibrids.

9. The paper of claim 3 wherein the paper is compacted by being calendered between rigid rolls heated to 125 to 400° C. at a nip pressure of 1500 to 5000 lbs/inch (268 to 894 kg/cm).

10. The paper of claim 4 wherein the paper is compacted by being calendered between rigid rolls heated to 125 to 400° C. at a nip pressure of 1500 to 5000 lbs/inch (268 to 894 kg/cm).

11. The paper of claim 2 wherein the length of the para-aramid floc is 1.3 to 6.4 mm.

12. High density para-aramid paper for use in electrical circuit board laminates having low coefficient of thermal expansion comprising 5 to 15 percent, by weight, of a water dispersible polymeric binder selected from the group consisting of epoxy resins, phenolic resins, polyester resins, polyureas, polyurethanes, melamine formaldehyde resins, and fluorocarbon resins and short para-aramid fibers made up of 0–50 volume percent para-aramid pulp and 50–100 volume percent para-aramid floc having lengths of 0.8 to 12.7 mm, the fibers being compacted at a nip pressure of 1500 to 5000 lbs/inch (268 to 894 kg/cm) to provide a volume percent para-aramid fiber in the paper of a least 53 minus 0.13 times the volume percent para-aramid floc in the fibers.

13. The paper of claim 12 wherein the para-aramid is poly(p-phenylene terephthalamide).

14. The paper of claim 12 wherein the volume percent para-aramid fiber in the ptaper is at least 63 minus 0.13 times the volume percent para-aramid floc in the fibers.

15. The paper of claim 13 wherein the volume percent para-aramid fiber in the paper is at least 63 minus 0.13 times the volume percent para-aramid floc in the fibers.

* * * * *